United States Patent
Corman et al.

(10) Patent No.: US 10,263,650 B2
(45) Date of Patent: *Apr. 16, 2019

(54) CALIBRATION OF ACTIVE ELECTRONICALLY STEERED ANTENNAS USING ON-CHIP PROGRAMMING

(71) Applicant: ANOKIWAVE, INC., San Diego, CA (US)

(72) Inventors: David Warren Corman, Gilbert, AZ (US); Robert McMorrow, Concord, MA (US); Andrew Street, Groton, MA (US); Vipul Jain, Irvine, CA (US); Kristian Madsen, Napa, CA (US); Robert Ian Gresham, Somerville, MA (US); Jonathan Comeau, Winchester, MA (US); Gaurav Menon, San Marcos, CA (US); Nitin Jain, San Diego, CA (US)

(73) Assignee: ANOKIWAVE, INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/860,508

(22) Filed: Jan. 2, 2018

(65) Prior Publication Data

US 2018/0234121 A1    Aug. 16, 2018

Related U.S. Application Data

(63) Continuation of application No. 15/253,384, filed on Aug. 31, 2016, now Pat. No. 9,876,514.

(51) Int. Cl.
*H04L 27/00* (2006.01)
*H04B 1/04* (2006.01)
(Continued)

(52) U.S. Cl.
CPC .............. *H04B 1/04* (2013.01); *G06F 3/061* (2013.01); *G06F 3/067* (2013.01); *G06F 3/0659* (2013.01);
(Continued)

(58) Field of Classification Search
CPC ........ H04B 1/04; H04B 17/12; H04B 7/0617; G06F 3/061; G06F 3/0659; G06F 3/067; G11C 17/16; G11C 17/18
(Continued)

(56) References Cited

U.S. PATENT DOCUMENTS 7,126,510 B2   10/2006  Alon et al.
8,120,532 B2    2/2012  Rofougaran et al.
(Continued)

*Primary Examiner* — Helene E Tayong
(74) *Attorney, Agent, or Firm* — Mintz Levin Cohn Ferris Glovsky and Popeo, P.C.

(57) ABSTRACT

In some example implementations, there may be provided methods for beamforming calibration of active electronically steered arrays (AESA). In some implementations, one or more adders may generate a phase offset by adding phase calibration data from non-volatile memory and phase command data from static memory, and/or generate a gain offset by adding gain calibration data from the non-volatile memory and gain command data from the static memory. Further, a phase-shift circuit can modify, based on the phase offset, a phase of a first output signal, and an amplitude gain circuit can modify, based on the gain offset, an amplitude of the first output signal. In accordance with these implementations, the modified phase of the first output signal and the modified amplitude of the first output signal are provided to enable pre-calibration of the first output signal and/or a first antenna. Related systems, methods, and articles of manufacture are also described.

19 Claims, 6 Drawing Sheets

(51) Int. Cl.
    *H04B 7/06*       (2006.01)
    *H04B 17/12*      (2015.01)
    *G06F 3/06*       (2006.01)
    *G11C 17/16*      (2006.01)
    *G11C 17/18*      (2006.01)

(52) U.S. Cl.
    CPC .............. *G11C 17/16* (2013.01); *G11C 17/18* (2013.01); *H04B 7/0617* (2013.01); *H04B 17/12* (2015.01)

(58) Field of Classification Search
    USPC ....................................................... 375/295
    See application file for complete search history.

(56) References Cited

U.S. PATENT DOCUMENTS

| | | |
|---|---|---|
| 9,495,285 B2 | 11/2016 | Hsu et al. |
| 2014/0111373 A1 | 4/2014 | Puzella et al. |
| 2015/0048242 A1 | 2/2015 | Remillard et al. |
| 2018/0084105 A1* | 3/2018 | Hiscock ............ H04M 1/72572 |

* cited by examiner

CALIBRATION OF ACTIVE ELECTRONICALLY STEERED ANTENNAS USING ON-CHIP PROGRAMMING

CROSS REFERENCE TO RELATED APPLICATIONS

This application is a continuation of U.S. application Ser. No. 15/253,384, filed on Aug. 31, 2016, and entitled CALIBRATION OF ACTIVE ELECTRONICALLY STEERED ANTENNAS USING ON-CHIP PROGRAMMING, the disclosure of which is incorporated herein by reference.

BACKGROUND

An active electronically steered array (AESA) may be used to generate direction-controlled beams, which may be useful in radar systems and/or other radio-based systems. Calibration of the antennas in an AESA can take place during operation of the AESA, and often involves additional hardware and/or processing. In some aspects, the calibration can involve periodic and/or continual monitoring, measuring, processing, and application of modifications to signals for each antenna in the AESA. This calibration is also often occurring at the same time that the operation of the AESA, and may reduce the processing resources of the AESA available for its operation. Thus, systems and/or methods for reducing calibration time and/or increasing the efficiency of calibration of AESAs may be desirable.

SUMMARY

In some example implementations, there may be provided methods for beamforming calibration of active electronically steered array (AESA). The method may provide for alignment of the gain and phase of one or more paths within an integrated circuit. In some aspects, the alignment can be achieved through application (ASIC) on-chip programming. The methods described herein may, in some implementations, reduce or eliminate a need for system level AESA calibration. Related systems, methods, and articles of manufacture are also described.

In an example implementation, an apparatus is provided. The apparatus comprises a first digital adder configured to generate a phase offset by at least adding phase calibration data obtained from non-volatile memory and phase command data obtained from static memory. The apparatus further comprises a phase-shift circuit configured to modify, based at least in part on the phase offset, a phase of a first output signal. The apparatus further comprises a second digital adder configured to generate a gain offset by at least adding gain calibration data from the non-volatile memory and gain command data from the static memory. The apparatus further comprises an amplitude gain circuit configured to modify, based at least in part on the gain offset, an amplitude of the first output signal. In accordance with this implementation, the modified phase of the first output signal and the modified amplitude of the first output signal are provided to enable pre-calibration of the first output signal.

In some implementations, the apparatus can further include a plurality of antennas configured to provide a plurality of radio signals to a point in space where the plurality of radio signals constructively interfere with each other to form a direction-controlled beam, where the plurality of antennas includes a first antenna. In some implementations, the pre-calibrated first output signal is provided, after modifying the phase and the amplitude, as an input to the first antenna. Thus, in some aspects, the pre-calibrated first output signal may be provided to enable pre-calibration of the first antenna.

In some implementations, the apparatus can further include a third digital adder configured to generate a second phase offset by at least adding second phase calibration data obtained from the non-volatile memory and second phase command data obtained from the static memory; a second phase-shift circuit configured to modify, based at least in part on the second phase offset, a phase of a second output signal; a fourth digital adder configured to generate a second gain offset by at least adding second gain calibration data from the non-volatile memory and second gain command data from the static memory; and a second amplitude gain circuit configured to modify, based at least in part on the second gain offset, an amplitude of the second output signal. In accordance with these implementations, the modified phase of the second output signal and the modified amplitude of the second output signal are provided to enable pre-calibration of a second antenna.

In some related implementations, a first antenna is enabled to provide, based on the first output signal, a first radio signal towards a point in space away from the apparatus to form at least a first portion of a direction-controlled beam. Similarly, the second antenna is enabled to provide, based on the second output signal, a second radio signal towards the point to form at least a second portion of the direction-controlled beam.

In some implementations, at least the phase calibration data and the gain calibration data are programmed into the non-volatile memory via burning of fuses, via electrically erasable programmable read-only memory, or via one-time programming. In related implementations, the phase calibration data is programmed based at least in part on a measured difference in phase between a first digital signal that is provided to a first antenna and a second radio signal that is output by a first antenna, wherein the second radio signal is based on the first digital signal, and wherein the phase command data is based on a desired characteristic of a direction-controlled beam, such as a strength of the direction-controlled beam and/or a direction of the direction-controlled beam.

In some implementations, the apparatus can further include one or more power splitting circuits configured to receive a first digital signal from an input source, where the one or more power splitting circuits are further configured to provide a plurality of digital signals to a plurality of antennas, and where the plurality of digital signals comprises the first output signal.

Implementations of the current subject matter can include systems and methods consistent with the present description, including one or more features as described, as well as articles that comprise a tangibly embodied machine-readable medium operable to cause one or more machines (e.g., computers, etc.) to result in operations described herein. Similarly, computer systems are also described that may include one or more processors and one or more memories coupled to the one or more processors. A memory, which can include a computer-readable storage medium, may include, encode, store, or the like one or more programs that cause one or more processors to perform one or more of the operations described herein. Computer implemented methods consistent with one or more implementations of the current subject matter can be implemented by one or more data processors residing in a single computing system or multiple computing systems. Such multiple computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to an enterprise resource software system or other business software solution or architecture, it should be readily understood that such features are not intended to be limiting. The claims that follow this disclosure are intended to define the scope of the protected subject matter.

DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

When practical, similar reference numbers denote similar structures, features, or elements.

DETAILED DESCRIPTION

On-chip calibration of beamforming ASICs may be used to align the gain and the phase of one or more paths within an integrated circuit (IC) to a predetermined set value so that some (if not all) parts (e.g., ICs, die, wafers, antennas, and/or the like) coming off of a production line act identically (or substantially uniform). Beamforming ICs are often the dominant source of path-to-path gain and/or phase variation within silicon AESAs, which can require expensive system calibration. Thus, reduction or elimination of the need for system level AESA calibration in these arrays may be desirable. Thus, implementations which utilize on-chip calibration of amplitude and phase are described herein, which can allow for system array calibration to be reduced or even eliminated.

Figure 1:
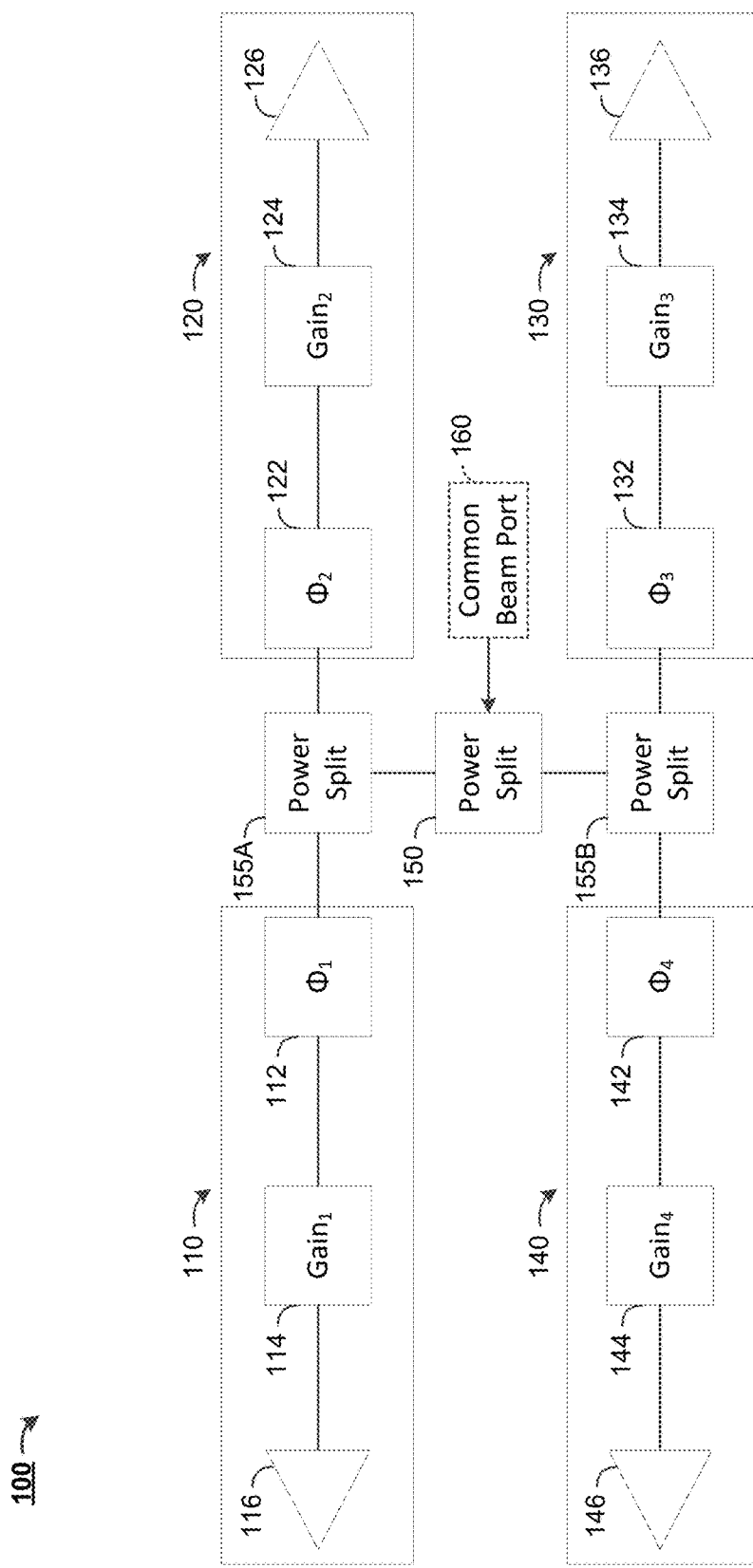
FIG. 1 depicts a block diagram of an example of a beamforming transmission integrated circuit.

FIG. 1 depicts a block diagram of an example of a beamforming transmission integrated circuit 100. The IC 100 may be referred to as a beamforming network. In some aspects, the beamforming IC 100 supports four radiating elements within an AESA. As illustrated, in some implementations, a common beam port 160 may be provided to a power splitter 150, which may provide half of the received power to each of two additional power splitters 155A-B. Each of the power splitters 155A-B may provide half of their received power to two element arms 110, 120, 130, and 140. As illustrated, each element arm 110, 120, 130, and 140 contains a gain control block 114, 124, 134, and 144 and a phase control block 112, 122, 132, and 142. The outputs 116, 126, 136, and 146 of each element arm 110, 120, 130, and 140 may be provided to one or more antenna (which may not be on the IC 100) corresponding to the element arm 110, 120, 130, and 140. The use of gain and phase control (e.g., phase and gain together can constitute a complex beam weight for each element) can allow for beam forming in an antenna far field, as described herein. In some aspects, the difference between a desired phase and a measured phase may be referred to as a phase error, and/or the difference between a desired amplitude and a measured amplitude may be referred to as an amplitude error. A phase error combined with an amplitude error can result in a vector error, which can cause misalignment in beams, thereby requiring calibration at the AESA level. Although the IC 100 is illustrated with four elements, more or less elements may be present in other implementations. Further, in various implementations, additional, less, and/or alternative components may be present within the IC 100.

The IC 100 may form at least a portion of an AESA. AESAs form electronically steerable beams, and are used in many radar and communications systems such as emerging 5G systems. In order to form a beam that spatially points in a given direction, beam steering must be applied such that energy from each radiating element can be coherently (e.g., in-phase, amplitude, and/or vector alignment) combined in the antenna's far field.

AESAs can implement beam steering by providing a unique radio frequency (RF) phase shift and/or gain setting (e.g., a well-defined vector) between each radiating element (e.g., antenna) and a beam summation point. In some aspects, a beam summation point may be a point at which all of the signals generated by the antennas of an AESA converge, which can form a steerable beam. Thus, emission of separate radio wave signals which constructively interfere with each other can be used to steer a radio signal. However, in order for effective beamforming to be achieved, the energy from each element in the AESA should arrive at the beam summation node at the same phase (e.g., via phase control), the same amplitude (e.g., via gain control), and/or the same vector orientation.

Some AESA systems may calibrate an array of antennas by measuring the amplitude and phase at each element in the array in a near field antenna range. When all gain and phase states within the array are set to the same value, the measured gain and phase at each element will also be the same. However, this is generally not the case due to part-to-part variation within the beamforming ICs and/or other contributors in the array, such as passive beamforming networks, other ICs (e.g., on the wafer), and/or the like. When the gain and phase measured at each element are not the same, then the measured error at each element can be stored in an array look-up table, and applied as an offset against the commanded amplitude and phase. However, this calibration method which requires continual monitoring, calculating, and updating can be time consuming and/or expensive for AESA systems to employ.

When considering the sources of gain and/or phase error from path to path in the array, the dominant error can typically occur within the beamforming ICs. Passive power dividers and splitters may contribute relatively little error since they, by design, can be symmetric corporate feed structures (e.g., same line lengths on all paths), and/or since they are generally manufactured on a common printed circuit board (PCB) so some (if not all) paths may see the same or similar loss tangent and dielectric constant. Relative errors between/among the various paths in an array generally affect beamforming, whereas absolute changes in gain and phase in an array might not.

In some aspects, transmission phase variation (e.g., S21 phase variation) based on a Monte Carlo performed on a Ka-band (e.g., 26.5 GHz-40 GHz) beamforming transmission IC may be high. For example, a through-phase ±3 sigma process variation can be ±96 degrees. This may be extremely high compared to typical least significant bits (LSB) used in beam steering. For example, LSBs for four-bit, five-bit, and six-bit phase controllers can be 22.5 deg, 11.25 deg, and 5.625 deg, respectively. As systems may require all paths within an array to be matched within one LSB, methods for reducing the part-to-part variation in through-phase may be beneficial.

Elimination of high phase variation (and/or by similarity, gain variation) may be provided by correcting for variations on the beamforming IC (e.g., where the problem is rooted). In various implementations, a system may measure gain and phase of each path within the IC. For example, a membrane probe may be used to measure gain and/or phase differences between an input to a path and an output of the path (e.g., via one or more of the element arms 110, 120, 130, 140). In some aspects, the measurement process may be automated. Thereafter, based on the measurements, the system can program corrective calibration coefficient data into the IC in a permanent manner. For example, non-volatile programming can be achieved by using burning of fuses, one-time programming (OTP), electrically erasable programmable read-only memory (EEPROM), and/or other similar techniques or structures. In some aspects, the programming procedure(s) may also be automated.

In some aspects, correlation within a given die may negate the need to measure all paths within that die. For example, measurement of only one path and programming of the same calibration data into all paths may be implemented (e.g., to reduce IC test time). Additionally or alternatively, a method of reducing cost can leverage the high level of correlation of ICs within a given wafer. For example, in some aspects, a system may be configured to measure only one part (e.g., die) per wafer and/or program all die of the wafer with the same calibration coefficients. Additionally or alternatively, a system may be configured to measure a sample of ICs (e.g., die) on a given wafer and/or program all ICs from that wafer with average calibration coefficients.

Figure 2:
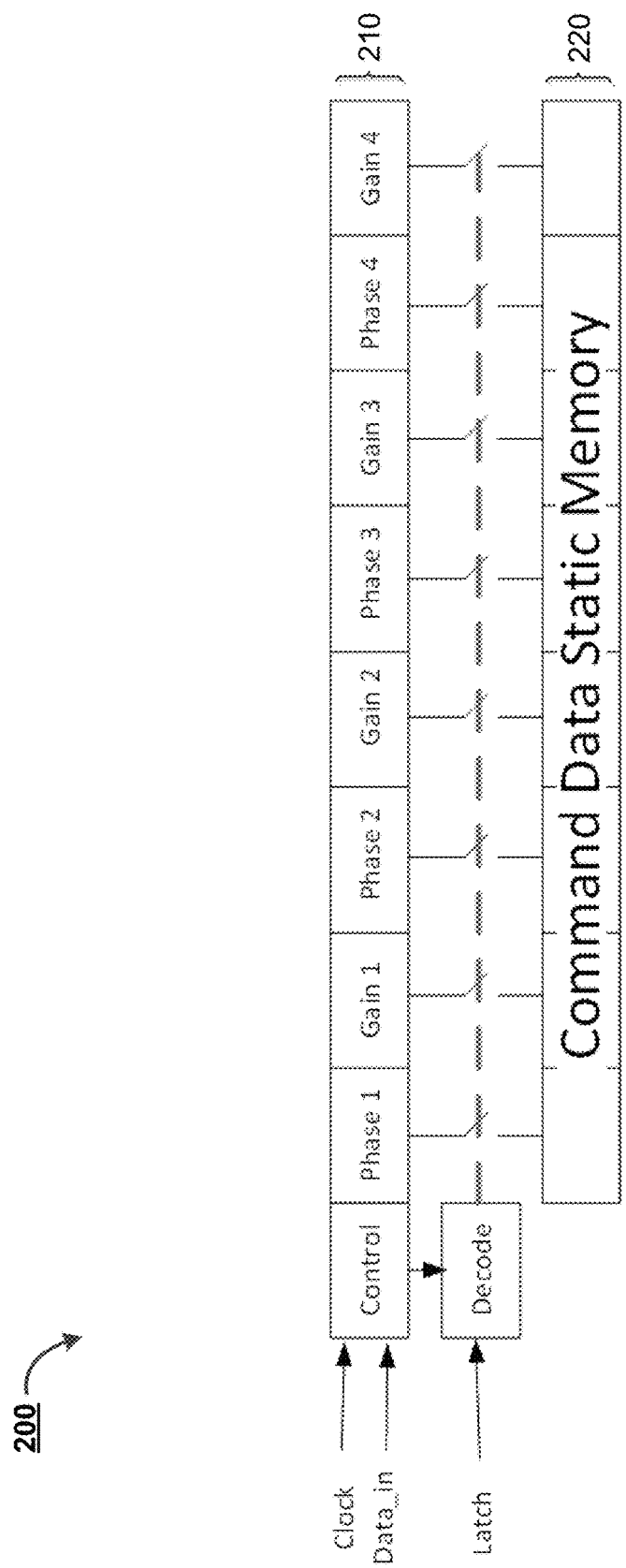
FIG. 2 depicts an example of a serial control system for a beamforming integrated circuit.

FIG. 2 depicts an example of a serial control system 200 for a beamforming integrated circuit. Serial control may be employed on AESA beamforming ICs. As illustrated, serial command data 210 in the form of desired gain and phase settings for each of the four element arms may be clocked in and/or latched into static memory 220 (e.g., when the serial sequence has been completed). However, as noted above, continually updating temporary memory may be inefficient.

Figure 3:
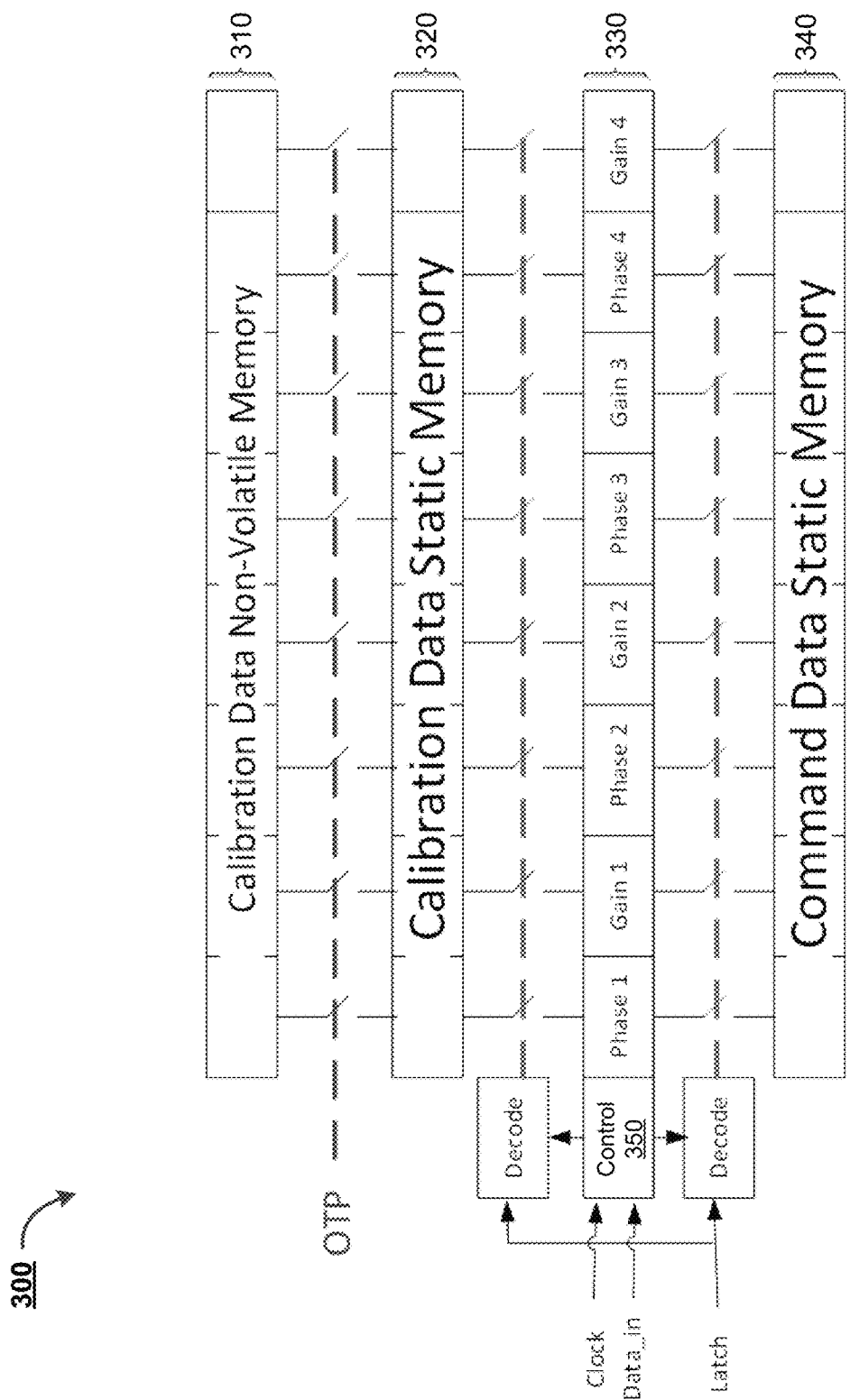
FIG. 3 depicts another example of a serial control system for a beamforming integrated circuit.

FIG. 3 depicts another example of a serial control system 300 for a beamforming integrated circuit. In various implementations, after a gain and a phase of each path within the IC is measured (e.g., during test) and/or found to need correction, calibration data can be permanently stored on the IC. A control circuit or module 350 in the serial stream can determine if data clocked in is intended to be command data or calibration data. If the data is calibration data then the data can be permanently stored on the IC using one-time programming (OTP) or other suitable method.

The non-volatile memory 310 storing the calibration data may allow for the data to remain upon power down of the IC. In various implementations, after an IC is powered on, calibration data may be provided to the static memory 320 from the non-volatile memory 310. In some aspects, this method may be transparent to the host system, which is sending ideal gain and phase setting commands to the IC. Errors that are resident on the IC due to process variations can be internally corrected on the IC without need for intervention by the host system.

Once the calibration data is permanently stored on the IC, the gain and phase in each element arm may be corrected. For example, during execution, the phase and gain command data 330 for each element arm may be determined based upon the calibration data from the static memory 320 and/or command data from static memory 340.

Figure 4A:
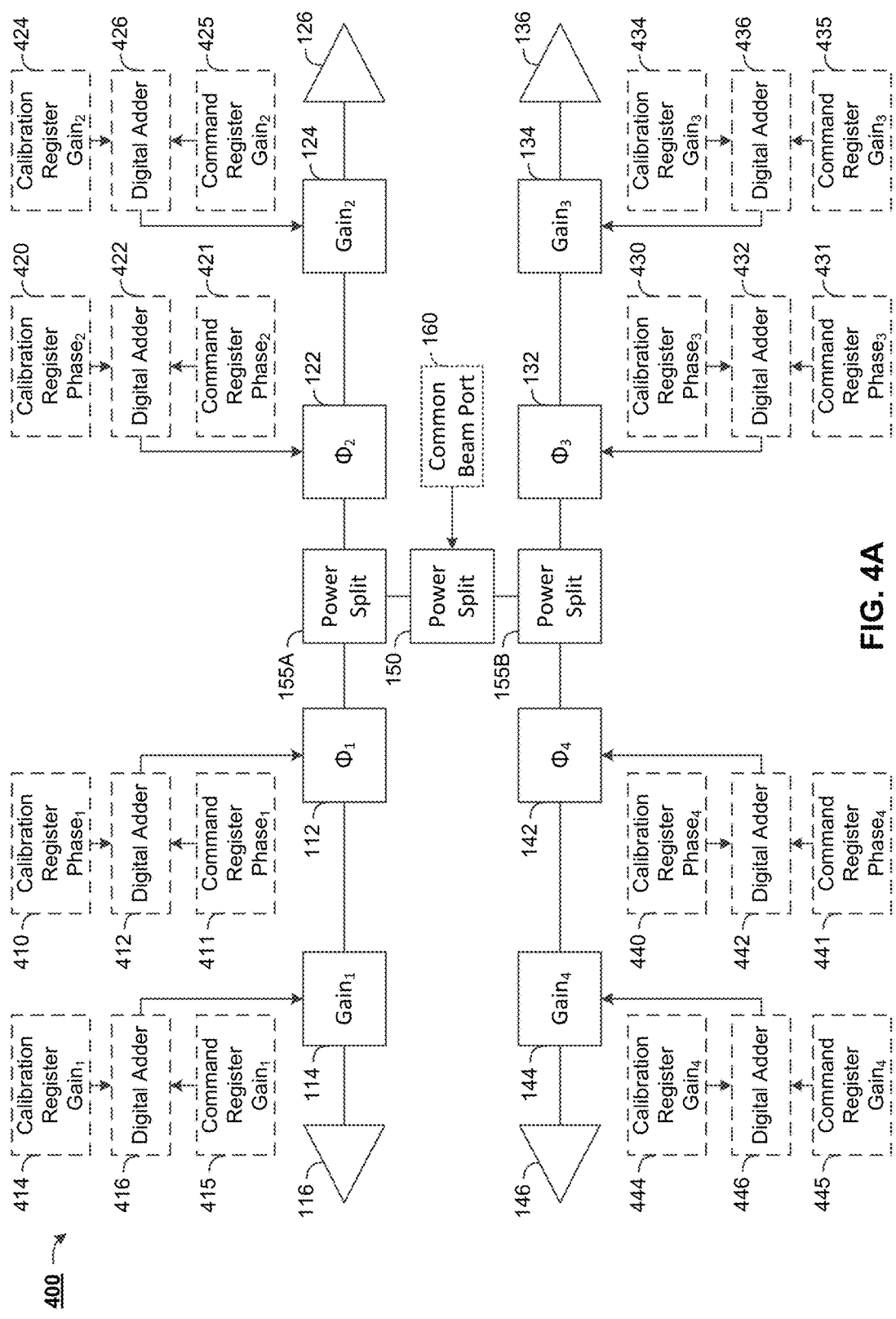
FIG. 4A depicts a block diagram of an example of a beamforming transmission integrated circuit with calibration.

FIG. 4A depicts a block diagram of an example of a beamforming transmission integrated circuit 400 which uses the calibration data described herein (e.g., the calibration data from the static memory 320 of FIG. 3). The illustrated dashed-line blocks may be digital functions (e.g., adding two or more values to create a new value) and/or the illustrated solid-line blocks may be RF functions (e.g., modifying an RF signal provided to an antenna).

For example, calibration register $phase_1$ 410 may include calibration data from a non-volatile memory source (e.g., non-volatile memory 310) or from a static memory source (e.g., static memory 320), and command register $phase_1$ 411 may include command data from a static memory source (e.g., static memory 340), which may change multiple times at runtime. Based upon the values from these two registers 410, 411, a digital adder 412 may be used to determine the sum of the two values. The determined sum may then be applied as a phase offset to a signal provided to an antenna through the phase block 112. A gain offset may similarly be applied to the signal provided to the antenna through the use of a calibration register $gain_1$ 414, a command register $gain_1$ 415, a digital adder 416, and the gain block 114. Although illustrated in sequence, in some implementations, the phase block 112 and the gain block 114 may be combined (such as in a combined vector modulator described herein) and/or may occur in a different order.

For each of the remaining phase blocks 122, 132, 142 in the IC 400, digital adders 422, 432, 442 can be used to sum the command phase values 421, 431, 441 with the calibration phase values 420, 430, 440, respectively, which may be applied as a phase offset for signals provided to a corresponding antenna. Similarly, for each of the remaining gain blocks 124, 134, 144 in the IC 400, digital adders 426, 436, 446 can be used to sum the command gain values 425, 435, 445 with the calibration gain values 424, 434, 444, respectively, which may be applied as a gain offset for signals provided to the corresponding antenna.

The approaches described herein can reduce the path-to-path phase variation to be within ±½ LSB for gain and/or phase, or a desired goal. Thus, the IC 400 may only otherwise be limited by the native granularity of the gain and phase functions. In some aspect, this all-digital approach may not impact or complicate RF functions in a meaningful way. As a non-limiting example of a benefit of the systems and/or methods described herein, AESAs may be able to produce high quality beams upon array power up without need for calibration. Similarly, addressing the system-level issues described herein that consumers face can add value to consumer products (e.g., in 5G wireless communication).

In some aspects, if other ICs are used in cascade with the calibrated IC (e.g., IC 400), or if other array errors are significant then system calibration may also be used.

Figure 4B:
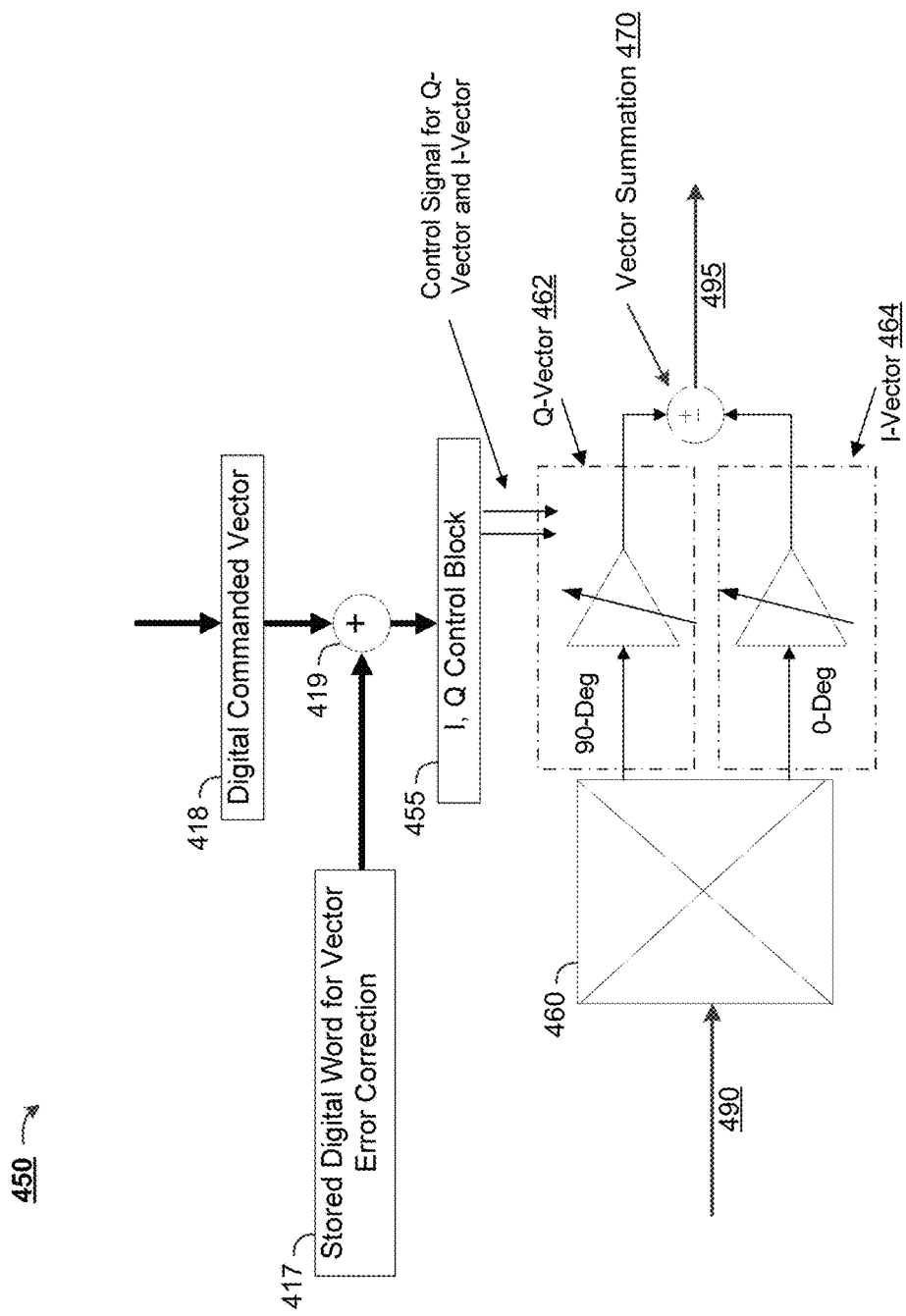
FIG. 4B depicts a block diagram of an example of a vector modulator.

FIG. 4B depicts a block diagram of an example of a vector modulator 450. As noted above, in various embodiments, functions of one or more of the phase control blocks 112, 122, 132, and 142 (e.g., phase modification) may be combined with functions of the respective gain control blocks 114, 124, 134, 144 (e.g., amplitude modification). The combined function(s) may be implemented through the use of the vector modulator 450. In some aspects, the vector modulator 450 may be implemented as an IQ vector modulator, which is capable of controlling both the amplitude and the phase of the transmitted signal at the same (or substantially the same) time.

As illustrated, the vector modulator 450 can include a hybrid module 460, which splits a received signal 490 (e.g., a signal generated by a power splitter 150, 155A, or 155B) into two signals which are 90-degrees out-of-phase from each other. These two signals may be referred to as the in-phase component (the "I" vector) and the quadrature-phase component (the "Q" vector). The two signals may be provided to an I-vector module 464 and a Q-vector module 462. As illustrated, each of the Q-vector module 462 and the I-vector module 464 may include a digital variable gain amplifier and/or a digital variable attenuator. These amplifiers and/or attenuators may be used to control the phase and/or amplitude of the input signal 490 such that the output signal 495 is the correct amplitude and/or phase for generation of an RF beam.

As illustrated, the phase and/or amplitude of the I-vector and the Q-vector may be controlled via an IQ control block 455. This control can be based on vector information obtained from memory, similar to the way that the phase shift and amplitude gain information is obtained, as described herein. For example, a digital word 417 for vector error correction from may be stored in non-volatile memory. This digital word 417 may be combined, during operation, with digital command vector 418 (e.g., stored in working memory) via the digital adder 419. In some embodiments, the digital word is used in digital form. In other embodiments, the digital word is converted into an analog current and voltage (e.g., via a digital to analog converter) before it is used to modify the input signal 490. The stored digital word may reflect a vector error, which is a difference between a desired vector to a measured vector. As described herein, the vector error may be determined by testing one or more of the antennas, and in various embodiments the vector error is stored permanently on an IC. In some aspects, the vector error may be stored as a negative and/or the digital adder 419 may be configured to add the negative of the vector error to command data to generate the desired control signal for an antenna.

The vector sum may be provided as an input to the IQ control block 455, which in turn provides one or more control signals to the Q-vector module 462 and/or the I-vector module 464. For example, in order to change the amplitude of the input signal 490, the vector modulator 450 can use an amplifier to modify the I vector and another amplifier to modify the Q vector, based on control signals, such that when the two components are combined, they are of a desired amplitude. A similar procedure may be performed to modify the phase of the input signal 490. In various embodiments, the vector modulator 450 may only correct for one of the amplitude or the phase of an input signal, and in other embodiments the vector modulator 450 can correct for both. In some aspects, the correction/modification may be performed through the use of a digital map. As further illustrated, vector summation circuit 470 (e.g., an in-phase combiner) may be used to combine the two components to form the output signal 495.

In some aspects, the resulting output signal 495 may be used to modify a signal provided to an antenna, such as one or more of the antennas 116, 126, 136, or 146 of FIG. 1A. In various implementations, each element arm 110, 120, 130, and/or 140 may include its own vector modulator 450, which may be alternative from (or in addition to) the separate gain and phase control blocks. Although a 90-degree shift is illustrated, other degrees of phase shift may be used (e.g., −90 degrees).

In some embodiments, the integrated circuit 400 of FIG. 4A and/or the vector modulator 450 of FIG. 4B may further comprise or otherwise utilize a resistor to generate a precise current. For example, a separate integrated circuit can be configured to utilize a resistor to generate the signal provided to the input source 160, the hybrid module 460, and/or another component in a chain of one or more components that ultimately provide the signal for use by the integrated circuit 400 or the vector modulator 450. In either event, a resistance of the resistor may be measured (e.g., before or after it is placed in the circuit), and this value may be used in conjunction with a desired current to determine a value of the voltage necessary to generate the desired current. The value of the voltage and/or the resistance may then be stored in non-volatile memory on the integrated circuit. In various embodiments, the voltage and/or the resistance value may be burned onto the IC through OTP or other methods described herein. The non-volatile memory storing the voltage value and/or the resistance value can include the calibration data non-volatile memory 310 or some other non-volatile memory. In some aspects, storing the voltage and/or the resistance in non-volatile memory can provide for pre-calibration of an IC.

Figure 5:
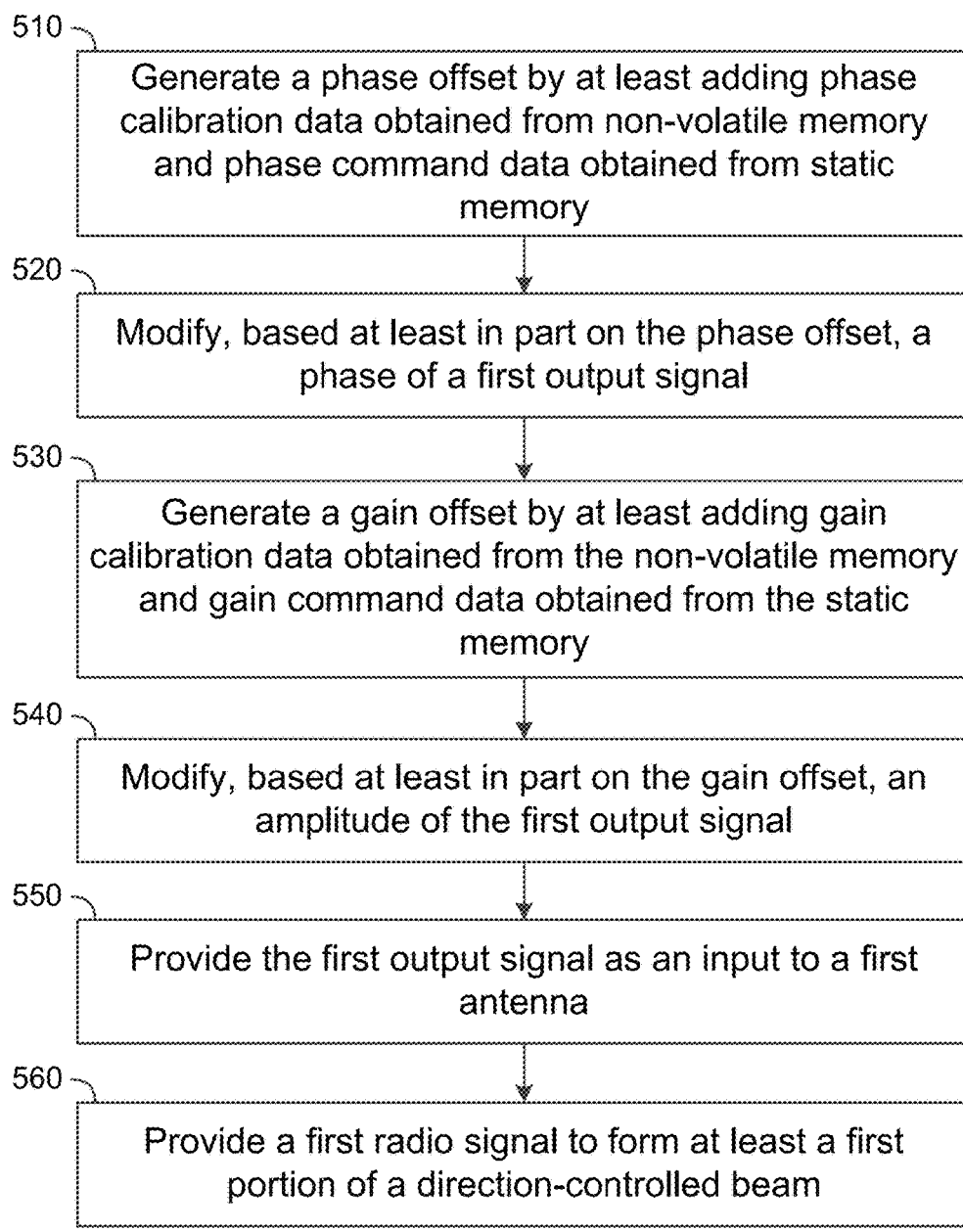
FIG. 5 depicts an example method for beamforming calibration of active electronically steered antennas, in accordance with various implementations.

FIG. 5 depicts an example method 500 for beamforming calibration of active electronically steered antennas, in accordance with various implementations. In some aspects, the method 500 may be performed by at least a portion of the integrated circuit 400 of FIG. 4A. Although each of the steps of method 500 are illustrated as occurring in a specific order and/or are described as being performed by a specific circuit/component, in various implementations not all of the steps may be present, the order of the steps may vary, more steps may be present, and/or the steps may be performed by another circuit/component or the like.

As illustrated, method 500 may start at block 510, where a first digital adder 412, for example, may generate a phase offset by at least adding phase calibration data obtained from non-volatile memory and phase command data obtained from static memory.

Method 500 may proceed to block 520, where a phase shift circuit 112, for example, may modify, based at least in part on the phase offset, a phase of a first output signal.

Method 500 may proceed to block 530, where a second digital adder 416, for example, may generate a gain offset by at least adding gain calibration data obtained from the non-volatile memory and gain command data obtained from the static memory.

Method 500 may proceed to block 540, where an amplitude gain circuit 114, for example, may modify, based at least in part on the gain offset, an amplitude of the first output signal.

Method 500 may proceed to block 550, where the first output signal may be provided as an input to a first antenna 116, for example. In some implementations, the first output may be provided as the input after modifying the phase and the amplitude. In various aspects, the modified phase of the first output signal and the modified amplitude of the first output signal are provided to enable pre-calibration of the first output signal and/or a first antenna 116, for example. A pre-calibrated antenna may refer to an antenna which is calibrated at design time, production time, manufacture time, and/or testing time. Thus, during operation of the antenna (e.g., used by a user or equipment), the requirement for calibration may be reduced and/or eliminated.

In some aspects, the first output signal is useable to provide a first radio signal to form at least a first portion of a direction-controlled beam. For example, method 500 may proceed to block 560, where a first antenna 116, for example, may provide a first radio signal to form at least a first portion of a direction-controlled beam. In various implementations, the first antenna 116 is separate from the integrated circuit 400 and in other implementations the first antenna 116 is part of the integrated circuit 400.

In some aspects, method 500 can further include providing, via a plurality of antennas 116, 126, 136, 146 for example, a plurality of radio signals to a point in space where the plurality of radio signals constructively interfere with each other to form a direction-controlled beam.

In similar aspects, the method 500 may further include one or more of the following: a third digital adder 422, for example, generating a second phase offset by at least adding second phase calibration data obtained from the non-volatile memory and second phase command data obtained from the static memory; a second phase shift circuit 122, for example, modifying a phase of a second output signal based at least in part on the second phase offset; a fourth digital adder 426, for example, generating a second gain offset by at least adding second gain calibration data obtained from the non-volatile memory and second gain command data obtained from the static memory; and a second amplitude gain circuit 124, for example, modifying an amplitude of the second output signal based at least in part on the second gain offset. In accordance with these aspects, the modified phase of the second output signal and the modified amplitude of the second output signal can be provided to enable pre-calibration of a second antenna.

In related implementations, a first antenna 116, for example, is enabled to provide, based on the first output signal, a first radio signal towards a point in space away from the apparatus to form at least a first portion of a direction-controlled beam, and the second antenna is enabled to provide, based on the second output signal, a second radio signal towards the point to form at least a second portion of the direction-controlled beam. In various implementations, additional antennas may be present.

In some aspects, at least the phase calibration data and the gain calibration data are programmed into the non-volatile memory through at least one of burning of fuses, one-time programming, and electrically erasable programmable read-only memory. For example, the phase calibration data can be programmed into the non-volatile memory based at least in part on a measured difference in phase between a first digital signal that is provided to a first antenna 116, for example, and a second radio signal that is output by the first antenna 116, where the second radio signal is based on the first digital signal. Similarly, the gain calibration data can be programmed into the non-volatile memory based at least in part on a measured difference in amplitude between a first digital signal that is provided to a first antenna 116, for example, and a second radio signal that is output by the first antenna 116, where the second radio signal is based on the first digital signal. This first digital signal may be provided to the first antenna 116, for example, at design time, production time, manufacture time, and/or testing time, where an amplitude and/or phase of the second radio signal generated based on the first digital signal are measured. Based at least in part upon these measurements, phase and/or amplitude calibration data may be permanently stored on the integrated circuit 400, for example. These measurements may be taken at/near a point in space away from the integrated circuit 400 where the direction-controlled beam is intended to be formed (at least in part).

During operation, command data, such as the phase command data and/or the gain command data, may be determined, temporarily stored in a register, and/or provided to the integrated circuit 400, for example. This command data may be used to control operation of one or more antennas to form the direction-controlled beam. For example, the command data may be based on and/or used to control a desired characteristic of the direction-controlled beam, such as a direction and/or strength of the beam.

In some aspects, the method 500 may include receiving, by one or more power splitting circuits 150, 155A, 155B, for example, a first digital signal from an input source 160, for example. In accordance with these aspects, the one or more power splitting circuits 150, 155A, 155B, for example, may provide a plurality of digital signals to a plurality of antennas, where the plurality of digital signals comprises the first output signal. As described herein, one or more of the plurality of digital signals may be modified based on properties of the respective antennas to which the digital signal is provided. In some aspect, one or more of the plurality of digital signals may be substantially the same in amplitude, phase, and/or the like before they are modified.

In various implementations, method 500 can include generating, by a digital adder 419, for example, a vector offset by at least adding vector calibration data obtained from non-volatile memory and vector command data obtained from static memory. Method 500 can also include modifying, by a vector correction circuit 450 (or a portion thereof), for example, a phase and/or an amplitude of a first output signal 490, for example, based at least in part on the vector offset. The modified phase of the first output signal and/or the modified amplitude of the first output signal can be provided to enable pre-calibration of the first output signal and/or a first antenna 116, for example. In some aspects, the vector calibration data includes a stored digital word 417, for example, which indicates an offset for one or both of the phase of the first output signal and the amplitude of the first output signal. In related embodiments, the vector command data is based on a desired characteristic of a direction-controlled beam (e.g., command data for the operation of an antenna).

As a non-limiting example of a benefit of the method 500, time spent processing/calculating amplitude gain and/or phase shift data for one or more of a plurality of antennas in an AESA may be reduced, and/or efficiency of an AESA may be improved.

As used herein, generating may refer to the actual generation of a radio-wave signal or may refer to the modification of a radio-wave signal which was originally generated by another circuit and/or device.

Although some specific examples are disclosed herein, they are merely examples as other types of circuits and component values may be used as well including sizing of components, differences in the logic circuits implementing the control, differences in the waveforms implementing the timing of the modulators, and/or the like.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer which may access a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus comprising:
   means for generating a vector offset by at least adding vector calibration data obtained from non-volatile memory and vector command data obtained from static memory, the vector offset comprising a phase offset and/or a gain offset; and
   means for modifying, based at least on the vector offset, a phase of an input signal and/or an amplitude of the input signal to provide an output signal, the modified phase and/or the modified amplitude provided to enable pre-calibration of the output signal, the pre-calibrated output signal provided as an input to a first antenna of a plurality of antennas configured to provide a plurality of radio signals for interfering with each other to form a directionally-controlled beam, wherein the vector calibration data comprises a stored digital word indicative of an offset for at least one of the phase of the input signal and/or the amplitude of the input signal.

2. The apparatus of claim 1, wherein the vector calibration data is programmed into the non-volatile memory via at least one of burning of fuses, one-time programming, and electrically erasable programmable read-only memory.

3. The apparatus of claim 2, wherein the vector calibration data is programmed based at least on a measured difference in phase between a digital signal that is provided to the first antenna and a second radio signal that is output by the first antenna, wherein the second radio signal is based on the digital signal.

4. The apparatus of claim 2, wherein the vector command data is based at least on a desired characteristic of the directionally-controlled beam, and wherein the desired characteristic of the directionally-controlled beam comprises at least one of a strength of the directionally-controlled beam and a direction of the directionally-controlled beam.

5. The apparatus of claim 1, further comprising:
   means for splitting the input signal into an in-phase component and a quadrature phase component;
   means for modifying an amplitude of the in-phase component based at least in part on the vector offset;
   mean for modifying an amplitude of the quadrature phase component based at least in part on the vector offset; and
   means for combining the modified in-phase component and the modified quadrature phase component to provide the output signal.

6. An apparatus comprising:
   a digital adder configured to generate a vector offset by at least adding vector calibration data obtained from non-volatile memory and vector command data obtained from static memory, the vector offset comprising a phase offset and/or a gain offset, the vector calibration data programmed into the non-volatile memory by at least burning of fuses, one-time programming, and/or electrically erasable programmable read-only memory; and a vector correction circuit configured to modify, based at least on the vector offset, a phase of an input signal and/or an amplitude of the input signal to provide an output signal, the modified phase and/or the modified amplitude provided to enable pre-calibration of the output signal, the vector calibration data programmed based at least on a measured difference in phase between a digital signal that is provided to an antenna and a radio signal that is output, based on the digital signal, by the antenna, wherein the pre-calibrated output signal is provided as an input to the antenna of a plurality of antennas configured to provide a plurality of radio signals that constructively interfere with each other to form a directionally-controlled beam.

7. The apparatus of claim 6, wherein the vector command data is based on a desired characteristic of a directionally-controlled beam, and wherein the desired characteristic of the directionally-controlled beam comprises at least one of a strength of the directionally-controlled beam and a direction of the directionally-controlled beam.

8. The apparatus of claim 6, further comprising:
a splitter configured to split the input signal into an in-phase component and a quadrature phase component;
a first amplifier configured to modify an amplitude of the in-phase component based at least in part on the vector offset;
a second amplifier configured to modify an amplitude of the quadrature phase component based at least in part on the vector offset; and
a combiner configured to combine the modified in-phase component and the modified quadrature phase component to provide the output signal.

9. An apparatus comprising:
means for generating a phase offset by at least adding phase calibration data obtained from non-volatile memory and phase command data obtained from static memory;
means for modifying, based at least on the phase offset, a phase of an output signal;
means for generating a gain offset by at least adding gain calibration data from the non-volatile memory and gain command data from the static memory; and
means for modifying, based at least on the gain offset, an amplitude of the output signal, the modified phase of the output signal and the modified amplitude of the output signal provided to enable pre-calibration of the output signal;
wherein the pre-calibrated output signal is provided as an input to an antenna of a plurality of antennas configured to provide a plurality of radio signals that constructively interfere with each other to form a directionally-controlled beam.

10. The apparatus of claim 9, further comprising: means for providing the plurality of radio signals to a point in space where the plurality of radio signals constructively interfere with each other to form the directionally-controlled beam.

11. The apparatus of claim 9, further comprising:
means for generating a second phase offset by at least adding second phase calibration data obtained from the non-volatile memory and second phase command data obtained from the static memory;
means for modifying, based at least in part on the second phase offset, a phase of a second output signal;
means for generating a second gain offset by at least adding second gain calibration data from the non-volatile memory and second gain command data from the static memory; and
means for modifying, based at least in part on the second gain offset, an amplitude of the second output signal, wherein the modified phase of the second output signal and the modified amplitude of the second output signal are provided to enable pre-calibration of a second antenna.

12. The apparatus of claim 11, wherein a first antenna is enabled to provide, based on the output signal, a radio signal towards a point in space away from the apparatus to form at least a first portion of a directionally-controlled beam, and wherein the second antenna is enabled to provide, based on the second output signal, a second radio signal towards the point to form at least a second portion of the directionally-controlled beam.

13. The apparatus of claim 9, wherein the pre-calibrated output signal is provided, after modifying the phase and the amplitude, as an input to a first antenna.

14. The apparatus of claim 9, wherein at least the phase calibration data and the gain calibration data are programmed into the non-volatile memory via at least one of burning of fuses, electrically erasable programmable read-only memory, and one-time programming.

15. The apparatus of claim 14, wherein the phase calibration data is programmed based at least in part on a measured difference in phase between a digital signal that is provided to a first antenna and a radio signal that is output, based on the digital signal, by the first antenna, and wherein the phase command data is based on a desired characteristic of a directionally-controlled beam.

16. The apparatus of claim 15, wherein the desired characteristic of the directionally-controlled beam comprises at least one of a direction of the directionally-controlled beam or a strength of the directionally-controlled beam.

17. The apparatus of claim 9, further comprising:
means for receiving a first digital signal from an input source; and
means for providing a plurality of digital signals to a plurality of antennas, wherein the plurality of digital signals comprises the first output signal.

18. The apparatus of claim 9, further comprising:
means for providing resistance, wherein the apparatus generates a digital signal based at least in part on a calibration voltage programmed in the non-volatile memory, and wherein the calibration voltage is programmed based at least in part on a measured resistance of the means for providing resistance and a desired characteristic of the digital signal.

19. The apparatus of claim 18, wherein the output signal is generated based at least in part on the digital signal, and wherein the desired characteristic comprises a desired current of the digital signal.

* * * * *